(12) United States Patent
Lin et al.

(10) Patent No.: US 7,828,520 B2
(45) Date of Patent: Nov. 9, 2010

(54) FAN

(75) Inventors: Tzyy-Pyng Lin, Kaohsiung (TW); Fu-Kuei Chang, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 730 days.

(21) Appl. No.: 11/685,774

(22) Filed: Mar. 14, 2007

(65) Prior Publication Data
US 2008/0223554 A1    Sep. 18, 2008

(51) Int. Cl.
F04D 29/44    (2006.01)

(52) U.S. Cl. .................. 415/192; 415/195; 416/175; 416/235

(58) Field of Classification Search .......... 415/192, 415/194, 195, 162, 200, 203, 206; 416/203, 416/175, 234, 235
See application file for complete search history.

(56) References Cited

U.S. PATENT DOCUMENTS 7,008,180 B2 *   3/2006   Fujimori et al. .......... 415/121.2
2003/0123975 A1 *   7/2003   Horng et al. ................ 415/119

* cited by examiner

Primary Examiner—Edward Look
Assistant Examiner—Dwayne J White

(57) ABSTRACT

A fan includes a fan blade wheel and a fan frame. A fan wheel seat is disposed at the center of the air outlet of the fan frame and the air outlet faces a heat generating component. An air inlet of the fan frame is disposed opposite to the air outlet. The fan wheel has a hub with first blades and projections extending radially from the circumferential side of the hub. The projections are disposed between every two of the first blades alternately such that it is auxiliary for guiding airflow outward the fan smoothly. Hence, air pressure at the air outlet increases greatly for enhancing effect of heat dissipation effectively.

3 Claims, 6 Drawing Sheets

FAN

BACKGROUND OF THE INVENTION

1. Field of the Invention

The present invention is related to a fan and particularly to a fan employed on a radiator.

2. Brief Description of the Related Art

Referring to FIGS. 1 and 2, the conventional fan includes a fan blade wheel 11 and a fan frame 12. The fan blade wheel 11 provides a hub 111 with a plurality of fan blades 112 extending radially from the circumferential side of the hub 111 as shown in FIG. 3. The fan frame 12 has four lateral side walls and an inner wall with an air inlet 123 and an air outlet 124. A fan blade wheel seat 121 is provided at the center of the air outlet 124. The air outlet 124 is mounted to a heat generating component 13 with fasteners 126 passing through engaging holes 125 at the four corners of the fan frame 12 such that the fan wheel 11 and the fan frame 12 are attached to the heat generating component 13.

The hub of the conventional fan device does not provide a guiding flow part except fan blades 112 so that the fluid flow moves toward all directions after passing through a space between every two neighboring fan blades once the fluid moves into the fan blade wheel 11. As a result, fluid pressure of the fluid moving toward the outlet 124 becomes getting lower due to resistance of the outer surface of the hub 111 and it is easy to result in reversed flow at low pressure area of the back of the hub 111 to affect heat dissipation.

SUMMARY OF THE INVENTION

Accordingly, an object of the present invention is to provide a fan in which the hub offers a function of guiding airflow.

In order to achieve the preceding object, a fan according to the present invention includes a fan blade wheel and a fan frame. A fan wheel seat is disposed at the center of the air outlet of the fan frame and the air outlet faces a heat generating component. An air inlet of the fan frame is disposed opposite to the air outlet. The fan wheel has a hub with first blades and elongated projections extending radially from the circumferential side of the hub. The projections are disposed between every two of the first blades alternately such that it is auxiliary for guiding airflow outward the fan smoothly. Hence, air pressure at the air outlet increases greatly for enhancing effect of heat dissipation effectively.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
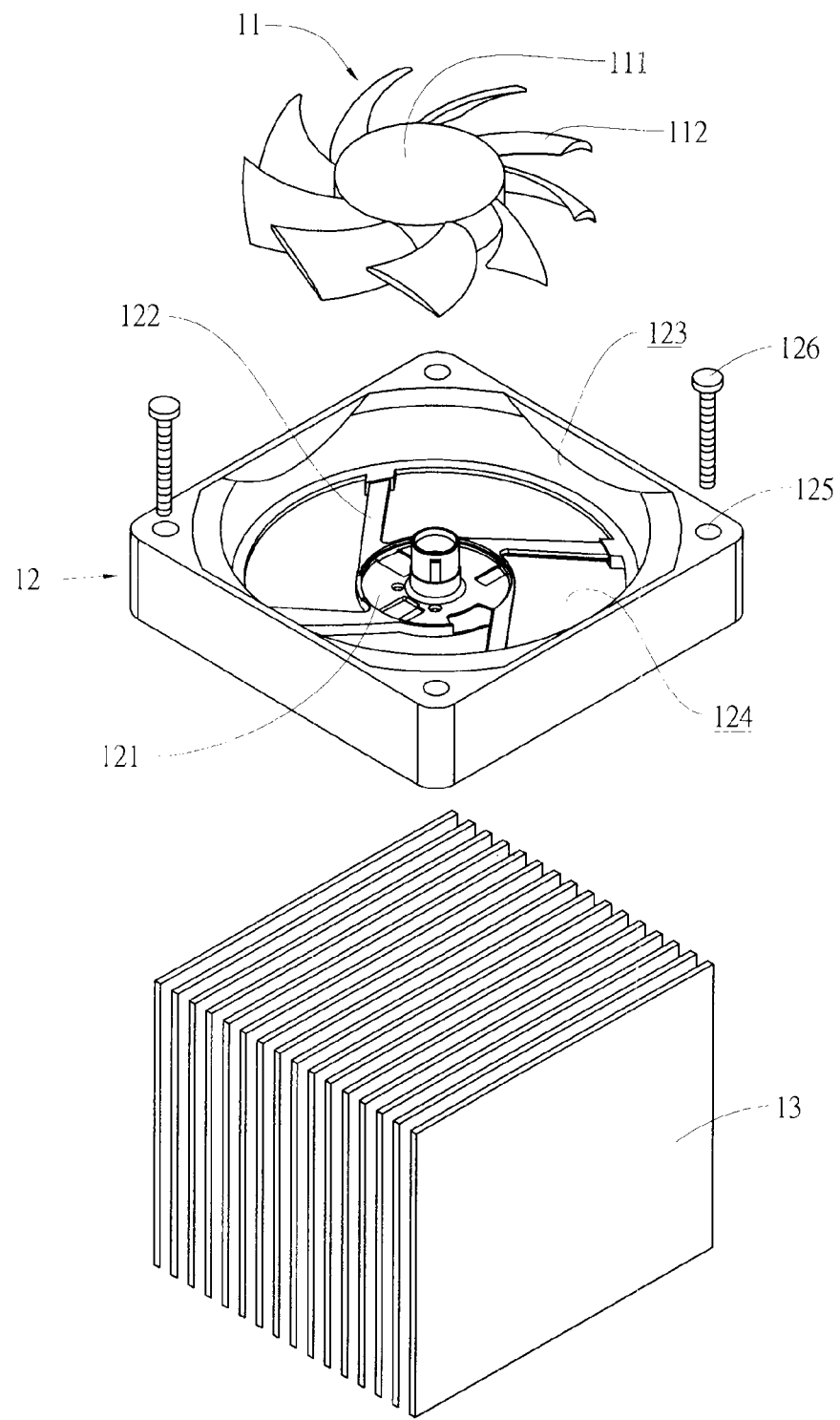
FIG. 1 is an exploded perspective view of the conventional fan.
Figure 2:
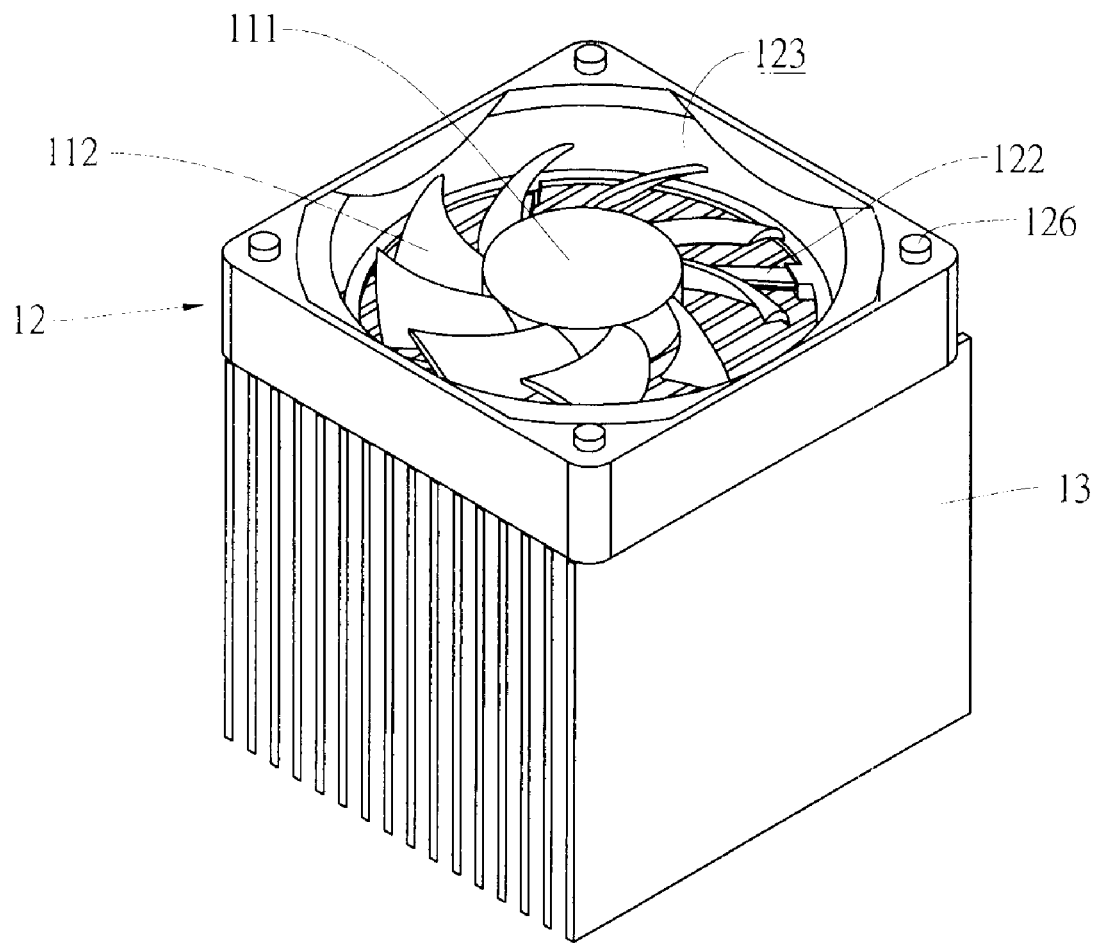
FIG. 2 is a perspective view of the conventional fan shown in FIG. 1.
Figure 3:
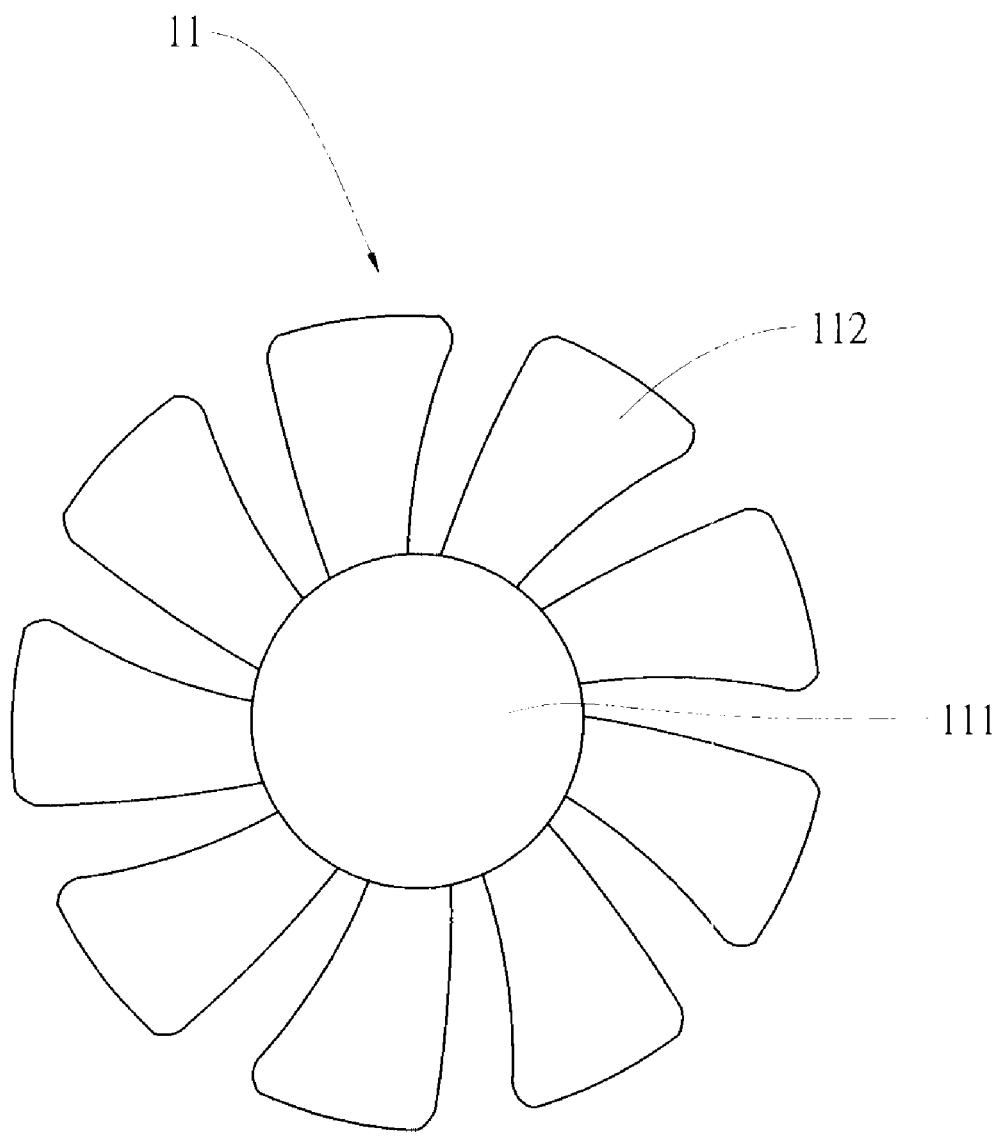
FIG. 3 is a top view of the fan blade wheel in the conventional fan.
Figure 4:
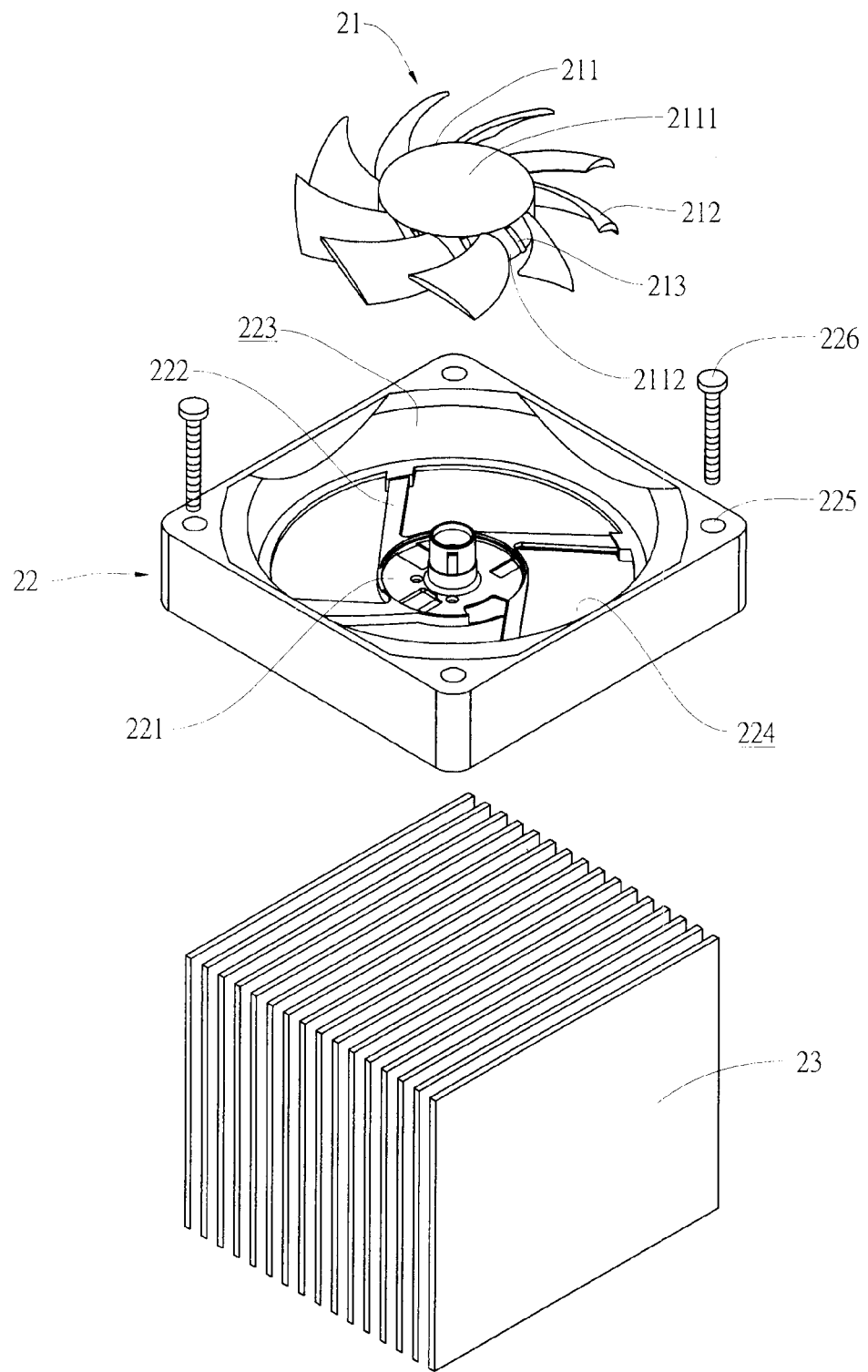
FIG. 4 is an exploded perspective view of a preferred embodiment of a fan device according to the present invention with a heat sink.
Figure 5:
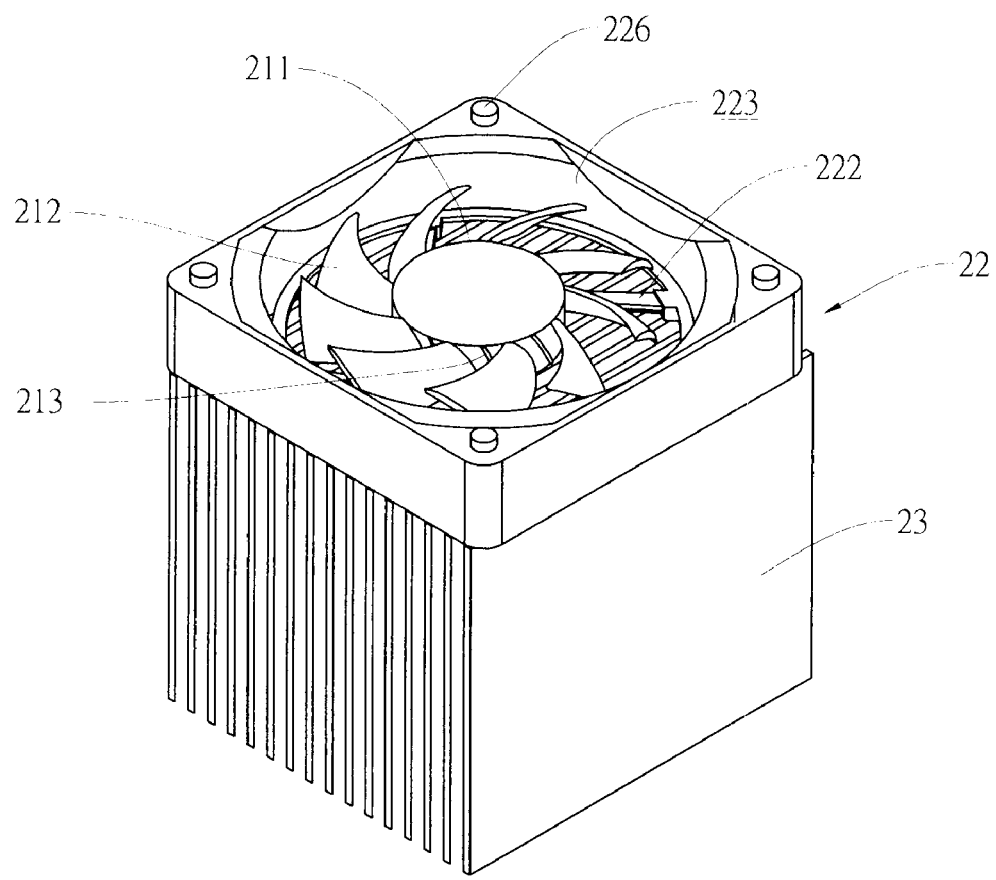
FIG. 5 is a perspective view of the fan device shown in FIG. 4 attached to the heat sink.

Referring to FIGS. 4 and 5, a preferred embodiment of the fan according to the present invention includes a fan blade wheel 21 and a fan frame 22. The fan frame 22 has four lateral side walls and an inner wall with a fluid inlet 223 and a fluid outlet side 224. A fan blade wheel seat 221 is provided at the center of the fluid outlet side 224. The fluid outlet 224 is mounted to a heat sink 23 with fasteners 226 passing through locating holes 225 at the four corners of the fan frame 22 such that the fan blade wheel 21 and the fan frame 22 are fastened to the heat generating component 23.

Figure 6:
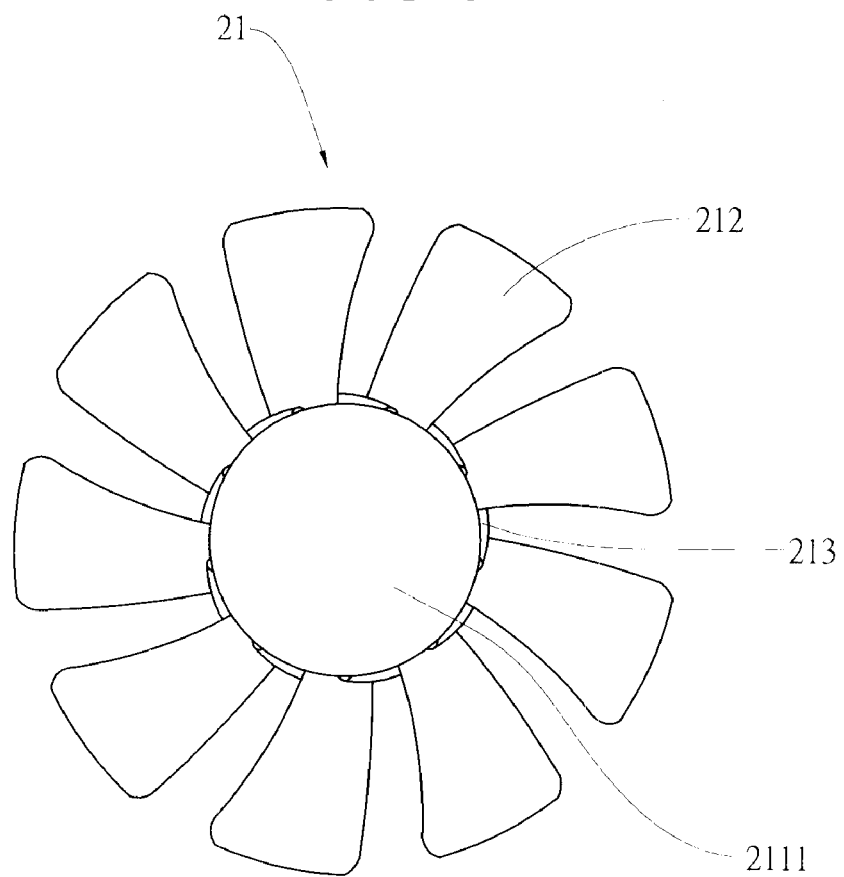
FIG. 6 is a top view of the fan blade wheel in the fan device according to the present invention.
Figure 7:
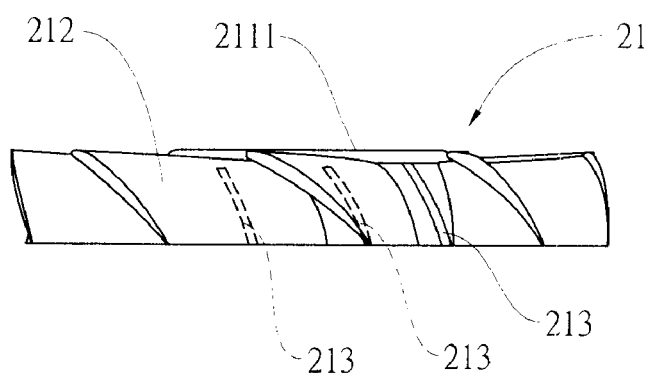
FIG. 7 is a side view of the fan blade wheel shown in FIG. 6.

The fan blade wheel 21 has a hub 211, which further includes a circular facial top 2111, a hollow bottom, and a circumferential side 2112 perpendicular to the facial top 2111. The inner side of the facial top 2111 provides a shaft (not shown) extending outward through the bottom and being rotationally joined to the fan blade wheel seat 221. A plurality of first blades 212 and a plurality of projections 213 which are shorter than the ends of the first blades 212 joined to circumferential side 2112. It can be seen in FIG. 6 that the projections 213 bulge outward from the outer surface of the circumferential side 2112. The projections 213 are disposed between every two of the first blades 212 alternately with the same inclination as the first blades 212 and each of projections 213 has an end disposed at the edge of the bottom and another end disposed close to the edge of the facial top 2111 (shown in FIG. 7).

The preceding projections 213 can be arranged to have the same configuration as the first blades 212 (not shown).

When airflow enters the fluid inlet 223 of the fan, the projections 213 are capable of guiding airflow near or moving along the hub 211 to allow the airflow moving outward the fan directly without reducing air pressure for enhancing heat dissipation effect.

While the invention has been described with referencing to preferred embodiments thereof, it is to be understood that modifications or variations may be easily made without departing from the spirit of this invention, which is defined by the appended claims.

What is claimed is:

1. A fan comprising:
    a fan wheel having a hub with a facial top, a hollow bottom, and a circumferential side, having a plurality of fan blades extending outward the circumferential side with an inclination; and
    a fan frame having a fluid inlet, a fluid outlet, and a fan blade wheel seat at a center of said fluid outlet for being joined to the fan wheel;
    wherein said circumferential side provides an elongated projection between every two neighboring blades respectively, said projection bulges outward the outer surface of said circumferential side with an end disposed at the bottom and another end disposed at the edge of said facial top such that when airflow enters the fluid inlet, said projection is capable of guiding airflow near or moving along the hub to allow the airflow moving outward the fan directly without reducing air pressure.

2. The fan as defined in claim 1, wherein the fan wheel seat is joined to an inner wall of said fluid outlet with a plurality of rib bars.

3. The fan as defined in claim 1, wherein the projections have the same inclinations as the blades.

* * * * *